United States Patent
Wang et al.

(10) Patent No.: US 9,722,005 B2
(45) Date of Patent: Aug. 1, 2017

(54) LIGHT-EMITTING DEVICE, ARRAY SUBSTRATE, DISPLAY DEVICE AND MANUFACTURING METHOD OF LIGHT-EMITTING DEVICE

(71) Applicant: BOE TECHNOLOGY GROUP CO., LTD., Beijing (CN)

(72) Inventors: Huifeng Wang, Beijing (CN); Ze Liu, Beijing (CN); Gang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/420,736

(22) PCT Filed: Jun. 30, 2014

(86) PCT No.: PCT/CN2014/081120
§ 371 (c)(1),
(2) Date: Feb. 10, 2015

(87) PCT Pub. No.: WO2015/062297
PCT Pub. Date: May 7, 2015

(65) Prior Publication Data
US 2016/0035802 A1    Feb. 4, 2016

(30) Foreign Application Priority Data
Oct. 28, 2013  (CN) .......................... 2013 1 0516699

(51) Int. Cl.
*H01L 29/08* (2006.01)
*H01L 27/32* (2006.01)
*H01L 51/56* (2006.01)

(52) U.S. Cl.
CPC .......... *H01L 27/3246* (2013.01); *H01L 51/56* (2013.01)

(58) Field of Classification Search
CPC ........................... H01L 27/3246; H01L 51/56
See application file for complete search history.

(56) References Cited

U.S. PATENT DOCUMENTS

2008/0309230 A1* 12/2008 Yang ................... H01L 27/3211
313/504
2013/0092918 A1*  4/2013 Okumoto ............ H01L 51/0007
257/40

(Continued)

FOREIGN PATENT DOCUMENTS

CN       1722917 A     1/2006
CN     101055830 A    10/2007

(Continued)

OTHER PUBLICATIONS

Search Report issued in International Application No. PCT/CN2014/081120, thirteen (13) pages.

(Continued)

*Primary Examiner* — Allen Parker
*Assistant Examiner* — Wasiul Haider
(74) *Attorney, Agent, or Firm* — Nath, Goldberg & Meyer; Joshua B. Goldberg; Annie J. Kock

(57) ABSTRACT

The present invention discloses a light-emitting device, array substrate, display device and manufacturing method of light-emitting device. The light-emitting device comprises a substrate and a pixel define layer provided on the substrate, the pixel define layer defines at least one pixel unit, each of which comprises a plurality of first electrodes, an organic layer provided on the plurality of first electrodes, and a second electrode provided on the organic layer. The light-emitting device, array substrate, display device and manufacturing method provided by the present invention can allow the formed film of the organic layer on the first electrodes to have good flatness and allow portions of the organic layer on different first electrodes to have substan- (Continued)

tially the same thickness, thus flatness and uniformity of the formed film of the organic layer in the light-emitting device is improved and further display quality of the light-emitting device is improved.

16 Claims, 7 Drawing Sheets

(56) References Cited

U.S. PATENT DOCUMENTS

| | | |
|---|---|---|
| 2013/0105821 A1 | 5/2013 | You et al. |
| 2013/0207085 A1 | 8/2013 | Im et al. |
| 2014/0001447 A1* | 1/2014 | Kim .................. H01L 27/3213 257/40 |
| 2014/0197385 A1* | 7/2014 | Madigan ................ H01L 51/56 257/40 |
| 2015/0001478 A1* | 1/2015 | Choi ................... H01L 27/3276 257/40 |
| 2015/0022079 A1* | 1/2015 | Okumura ............ H01L 51/5253 313/512 |
| 2015/0087098 A1* | 3/2015 | Kawanami .............. F04B 37/14 438/46 |

FOREIGN PATENT DOCUMENTS

| | | |
|---|---|---|
| CN | 103187434 A | 7/2013 |
| CN | 103353701 A | 10/2013 |
| CN | 103545457 A | 1/2014 |
| TW | 201001774 A | 1/2010 |

OTHER PUBLICATIONS

Chinese Office Action dated Jun. 30, 2015 issued in corresponding Chinese Application No. 201310516699.2.

* cited by examiner

-- Prior Art --

-- Prior Art --

LIGHT-EMITTING DEVICE, ARRAY SUBSTRATE, DISPLAY DEVICE AND MANUFACTURING METHOD OF LIGHT-EMITTING DEVICE

This is a National Phase Application filed under 35 U.S.C. 371 as a national stage of PCT/CN2014/081120, filed Jun. 30, 2014, and claims priority benefit from Chinese Application No. 201310516699.2, filed Oct. 28, 2013, the content of each of which is hereby incorporated by reference in its entirety.

FIELD OF THE INVENTION

The present invention relates to the field of display technology, and particularly to a light-emitting device, an array substrate, a display device and a manufacturing method of the light-emitting device.

BACKGROUND OF THE INVENTION

An organic light-emitting diode (OLED) display, compared to a liquid crystal display (LCD), has advantages of self-illumination, quick response, wide angle of view, high brightness, bright color, light weight and small thickness, and the like, and is considered to be the next generation display technology.

Modes for realizing colorization of OLED mainly include: R/G/B side by side mode, R/G/B/W square mode and white OLED in combination with color filter (WOLED+CF) mode.

WOLED+CF mode is considered to be the main mode used in mass production of large-sized OLEDs. Currently, white OLEDs are mainly manufactured through an open mask process or a solution process.

FIG. 1 is a schematic diagram of an OLED manufactured through an open mask process in the prior art. As shown in FIG. 1, the OLED manufactured through the open mask process comprises: a substrate 1, pixel define layers (PDLs) 2 formed on the substrate 1, first electrodes 4 formed between adjacent pixel define layers 2, an organic layer 5 formed on the first electrodes 4 and a second electrode 6 formed on the organic layer 5. The OLED comprises a plurality of PDLs 2 which define sub-pixel units 3, in each of which one first electrode 4 is included. The organic layer 5, as a whole, is formed by evaporation with an evaporation mask, and is one layer of thin film. However, the organic layer 5 is formed not only on the first electrodes 4 but also on the PDLs 2, and protrusions of the PDLs 2 with respect to the first electrodes 4 may cause portions of the organic layer 5 corresponding to edges of the first electrodes 4 to be uneven, which may result in relatively poor flatness of the formed film of the organic layer 5 on each first electrode 4. Also, since a condition that portions of the organic layer 5 on different first electrodes 4 have different thicknesses may occur in the evaporation process, the formed film of the organic layer 5 has a poor uniformity. If the uniformity is badly poor, a short circuit may even occur, and therefore, display quality of the OLED is severely influenced.

FIG. 2 is a schematic diagram of an OLED manufactured through a solution process in the prior art. As shown in FIG. 2, the OLED manufactured through the solution process comprises: a substrate 1, PDLs 2 formed on the substrate 1, first electrodes 4 formed between adjacent pixel define layers 2, an organic layer 5 formed on the first electrodes 4 and a second electrode 6 formed on the organic layer 5. The OLED comprises a plurality of PDLs 2 which define sub-pixel units 3, in each of which one first electrode 4 is included. The organic layer 5 is formed in each sub-pixel unit through the solution process, and in this case, edge portions of the organic layer 5 contacting with the PDLs 2 may form upward protrusions (i.e., coffee-ring phenomenon), which may result in relatively poor flatness of the formed film of each organic layer 5. Also, since a condition that portions of the organic layer 5 on different first electrodes 4 have different thicknesses may occur in the solution process, the formed film of the organic layer 5 has a poor uniformity, and thus display quality of the OLED is severely influenced.

SUMMARY OF THE INVENTION

An object of the present invention is to provide a light-emitting device, an array substrate, a display device and a manufacturing method of a light-emitting device, so as to improve flatness and uniformity of the formed film of an organic layer in the light-emitting device and further to improve display quality of the light-emitting device.

To achieve the above object, the present invention provides a light-emitting device, which comprises: a substrate and a pixel define layer provided on the substrate, the pixel define layer defining at least one pixel unit, each of which comprises a plurality of first electrodes, an organic layer provided on the plurality of first electrodes, and a second electrode provided on the organic layer.

Optionally, a fill pattern is formed between adjacent first electrodes.

Optionally, thickness of the fill pattern is smaller than that of the pixel define layer, and is substantially the same as that of the first electrode.

Optionally, a difference between the thickness of the fill pattern and the thickness of the first electrode ranges from −10 nm to 50 nm.

Optionally, the difference between the thickness of the fill pattern and the thickness of the first electrode is larger than 0 nm and smaller than or equal to 50 nm.

Optionally, the entire fill pattern has the same thickness.

Optionally, the pixel define layer has a ring-like structure.

Optionally, a longitudinal section of the pixel define layer is trapezoid-shaped or square-shaped.

Optionally, the pixel define layer defines one pixel unit, and is provided in a non-light emitting region on the periphery of the light-emitting device.

To achieve the above object, the present invention provides an array substrate, which comprises the above light-emitting device.

To achieve the above object, the present invention provides a display device, which comprises the above array substrate.

To achieve the above object, the present invention provides a manufacturing method of a light-emitting device, which comprises steps of:

forming a plurality of first electrodes on a substrate;

forming a pixel define layer on the substrate, the pixel define layer defining at least one pixel unit, each of which comprises more than one of the first electrodes;

forming an organic layer on the substrate, the organic layer being provided on the more than one of the first electrodes in the pixel unit; and forming a second electrode on the substrate, the second electrode being provided on the organic layer in the pixel unit.

Optionally, the manufacturing method further comprises a step of: forming a fill pattern between adjacent first electrodes.

Optionally, forming the fill pattern between the pixel define layer and the first electrodes adjacent thereto while forming the fill pattern between adjacent first electrodes.

Optionally, the step of forming an organic layer on the substrate comprises: forming the organic layer on the more than one of the first electrodes in the pixel unit through an evaporation process or a solution process.

The present invention can achieve the beneficial effects as follows.

In the light-emitting device, the array substrate and the display device provided by the present invention as well as the light-emitting device manufactured by using the manufacturing method of a light-emitting device provided by the present invention, the pixel define layer defines at least one pixel unit, each of which comprises multiple first electrodes and the organic layer is provided on the multiple first electrodes, so that the formed film of the organic layer on the multiple first electrodes has relatively good flatness and portions of the organic layer on different first electrodes have substantially the same thickness, thus flatness and uniformity of the formed film of the organic layer in the light-emitting device is improved and further display quality of the light-emitting device is improved.

DETAILED DESCRIPTION OF THE EMBODIMENTS

To enable those skilled in the art to better understand the technical solutions of the present invention, the light-emitting device, the array substrate, the display device and the manufacturing method of a light-emitting device provided by the present invention will be described in detail below in conjunction with the accompanying drawings.

Figure 1:
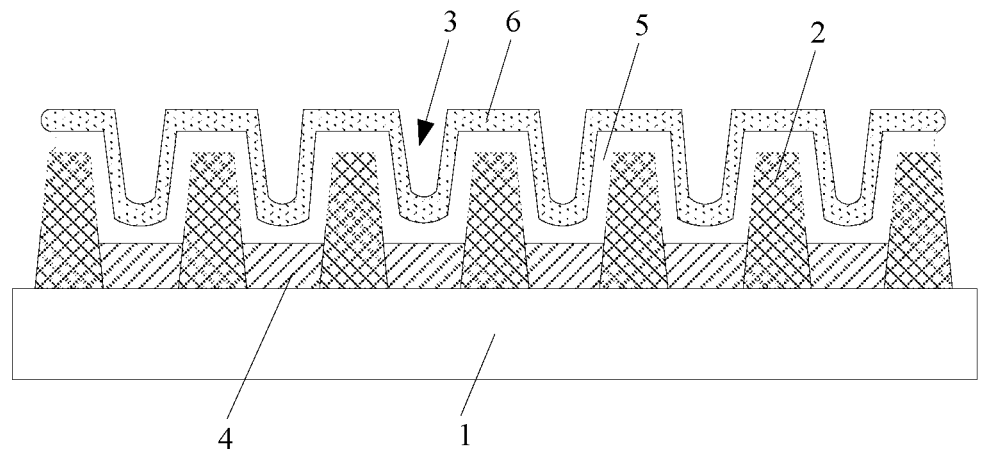
FIG. 1 is a schematic diagram of an OLED manufactured through an open mask process in the prior art.
Figure 2:
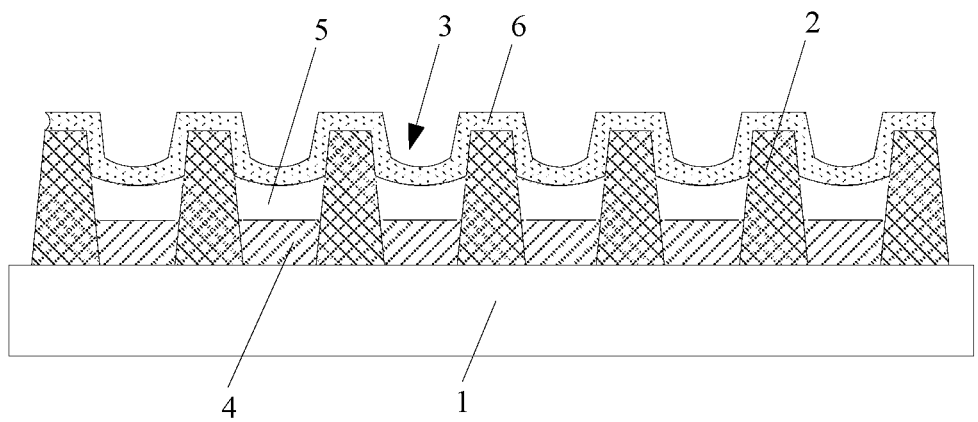
FIG. 2 is a schematic diagram of an OLED manufactured through a solution process in the prior art.
Figure 3:
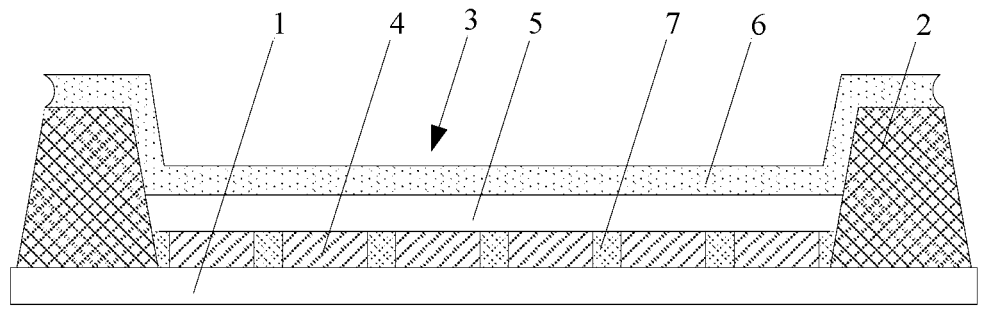
FIG. 3 is a schematic diagram of a structure of a light-emitting device provided by an embodiment of the present invention.

FIG. 3 is a schematic diagram of a structure of a light-emitting device provided by an embodiment of the present invention. As shown in FIG. 3, the light-emitting device comprises: a substrate 1 and a pixel define layer 2 provided on the substrate 1, the pixel define layer 2 defines at least one pixel unit 3, each of which comprises a plurality of first electrodes 4, an organic layer 5 provided on the plurality of first electrodes 4, and a second electrode 6 provided on the organic layer 5.

Figure 4:
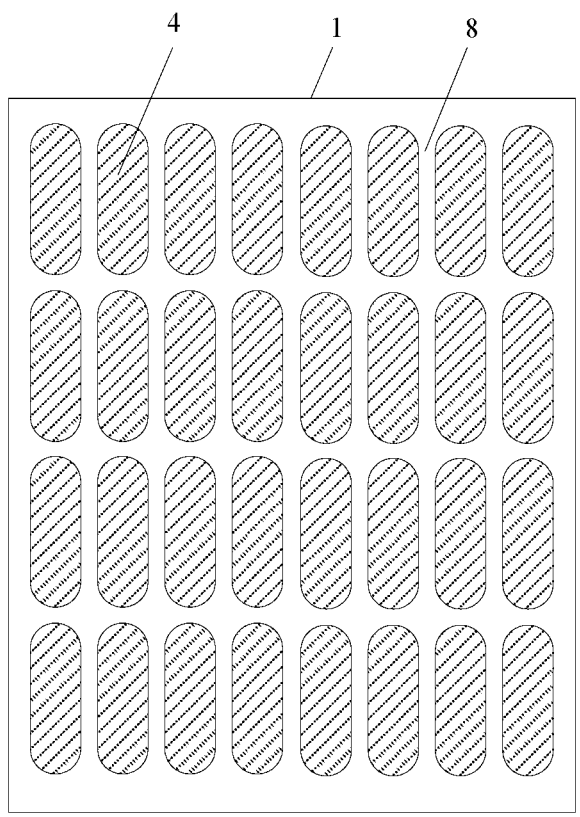
FIG. 4 is a planar diagram schematically illustrating first electrodes in the light-emitting device shown in FIG. 3.

FIG. 4 is a planar diagram schematically illustrating the first electrodes 4 in the light-emitting device shown in FIG. 3. As shown in FIGS. 3 and 4, the first electrodes 4 are arranged in an array on the substrate 1, and are evenly distributed on the substrate 1. A gap 8 is formed between two adjacent first electrodes 4. The first electrodes 4 may have a shape of parallelogram or oval, and the parallelogram may be a rectangle, a square or a diamond. In the present embodiment, preferably, the first electrodes 4 are rectangle-shaped. In actual applications, the first electrodes 1 may be of any other shape such as an arbitrary quadrilateral according to production requirements. The first electrodes 4 may be anodes or cathodes. If the first electrodes 4 are anodes, preferably, material of the first electrodes 4 may include a transparent or semi-transparent conductive material with high work function, for example, ITO, Ag, NiO, Al or grapheme; if the first electrodes 4 are cathodes, preferably, material of the first electrodes 4 may include a metal or metal composition with low work function, for example, any one or combination of Al, Mg, Ca, Ba, Na, Li, K and Ag. Area and thickness of the first electrodes 4 as well as the gap 8 may be randomly set as required, and the area of the first electrodes 4 and the gap 8 may be set according to pixel resolution.

Figure 5:
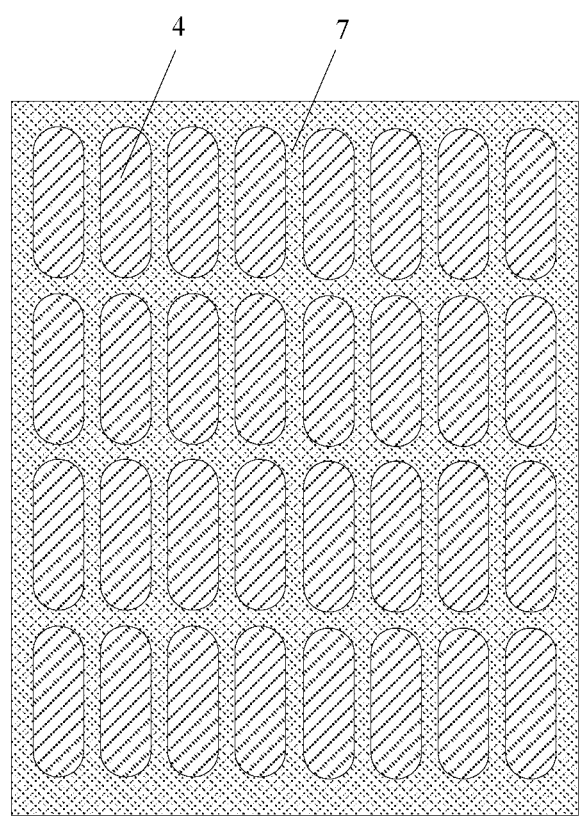
FIG. 5 is a planar diagram schematically illustrating fill patterns in the light-emitting device shown in FIG. 3.

FIG. 5 is a planar diagram schematically illustrating a fill pattern 7 in the light-emitting device shown in FIG. 3. As shown in FIGS. 3 and 5, the fill pattern 7 is formed between adjacent first electrodes 4. Further, the fill pattern 7 may be provided between the first electrode 4 and the pixel define layer 2. Specifically, the fill pattern 7 is provided in the gap 8 between adjacent first electrodes 4. Further, the fill pattern 7 is also provided in a gap between the first electrodes 4 and the pixel define layer 2. The fill pattern 7 fills between adjacent first electrodes 4, and by appropriately setting thickness difference between the fill pattern 7 and the first electrodes 4 (described below), the first electrodes 4 may achieve an effect of a planarization layer. Material of the fill pattern 7 may be a material with good film forming performance, high insulation and surface energy similar to that of the material of the first electrodes 4. The material of the fill pattern 7 may be organic material or inorganic material, for example, the organic material may be organic silicon resin or polyimide, and the inorganic material may be $SiO_2$ or ceramic. Specifically, when the first electrodes 4 are anodes, preferably, the material of the fill pattern 7 is inorganic material, and this is because inorganic material and the material (e.g., ITO) of the first electrodes 4 are similar in properties, which can effectively reduce differences between the material of the fill pattern 7 and the material of the first electrodes 4.

Thickness of the fill pattern 7 is smaller than that of the pixel define layer 2, and is substantially the same as that of the first electrodes 4. In a specific implementation, the thickness of the fill pattern 7 may be larger, smaller or equal to that of the first electrodes 4. Preferably, a difference d between the thickness of the fill pattern 7 and the thickness of the first electrodes 4 ranges from −10 nm to 50 nm. When the difference is within the above range, the first electrodes 4 can maintain relatively good planarization effect. Further preferably, the difference d between the thickness of the fill pattern 7 and the thickness of the first electrodes 4 is larger than 0 nm and smaller than or equal to 50 nm (i.e., 0 nm<d≤50 nm), which can not only effectively avoid electrostatic discharge of the first electrodes 4, but also allow the first electrodes 4 to maintain relatively good planarization effect. In the present embodiment, the number of the pixel unit(s) 3 may be one or more. Preferably, the entire fill pattern 7 has the same thickness, which facilitates manufacturing.

Figure 6:
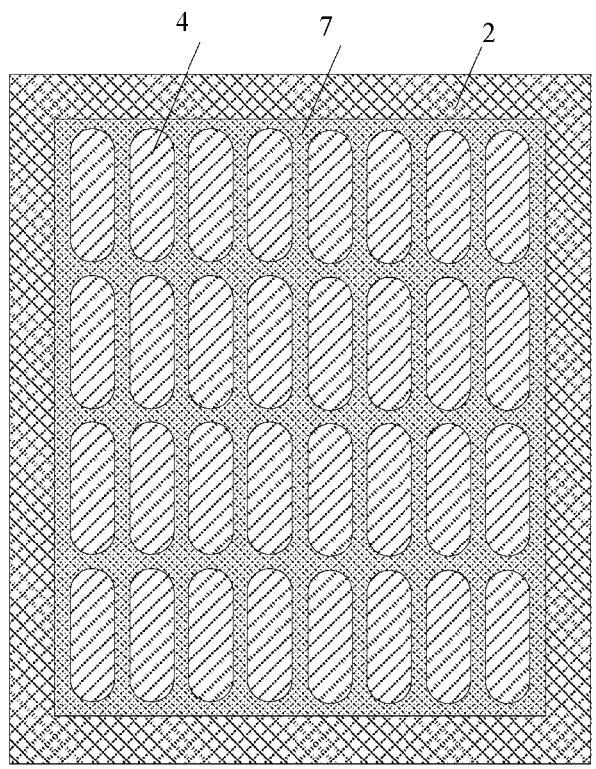
FIG. 6 is a planar diagram schematically illustrating a pixel define layer in the light-emitting device shown in FIG. 3.

FIG. 6 is a planar diagram schematically illustrating the pixel define layer 2 in the light-emitting device shown in FIG. 3. As shown in FIGS. 3 and 6, the pixel define layer 2 may define one or more pixel units 3 on the substrate 1, the number of the defined pixel unit(s) may be set according to actual requirements. In the present embodiment, a case that the pixel define layer 2 defines one pixel unit 3 is taken as an example. In this case, the pixel unit 3 comprises all of the sub-pixel units on the substrate 1, and preferably, the pixel define layer is provided in a non-light emitting region on the periphery of the light-emitting device. The pixel define layer may have a ring-like structure, and is provided around the plurality of first electrodes 4. Preferably, area of a region surrounded by the pixel define layer 2 is larger than that of a region formed by the plurality of first electrodes 4 included in the pixel unit 3 defined by the pixel define layer 2. Accordingly, a gap is formed between the pixel define layer 2 and the first electrodes 4, and the fill pattern is also formed in the gap. Therefore, planarization region can be enlarged, and when the organic layer is formed subsequently, portions of the formed film on the first electrodes at the utmost edge and the first electrodes in the middle maintain uniform. The thickness of the pixel define layer 2 is higher than the height of the fill pattern 7 (or the first electrodes 4), and specifically, is 0.1 mm to 100 mm, and preferably is 1 μm to 5 μm. Thicknesses of portions of the pixel define layer 2 may be the same or different, and preferably, the entire pixel define layer 2 has the same thickness. A longitudinal section of the pixel define layer 2 is trapezoid-shaped or square-shaped. In the present embodiment, the longitudinal section of the pixel define layer 2 is trapezoid-shaped, as shown in FIG. 3. Material of the pixel define layer 2 may be resin, polyimide, organosilicon or SiO2. The number of the first electrodes 4 included in each pixel unit 3 may be set according to actual requirement, and in the present embodiment, a case that each pixel unit 3 includes 32 first electrodes 4 is taken as an example.

Although the above description is given by taking a case that the pixel define layer 2 defines one pixel unit 3 on the substrate 1 as an example, it can be understood that each pixel unit 3 has the similar structure as that shown in FIGS. 3 and 6, when the pixel define layer 2 defines a plurality of pixel units 3, which is not elaborated herein.

Further, the organic layer 5 may comprise one or more organic layer units, each of which comprises any one or combination of a hole injection layer, a hole transport layer, an light emission layer, a hole blocking layer, an electron blocking layer, an electron transport layer and an electron injection layer. When the organic layer 5 comprises multiple organic layer units, the multiple organic layer units are connected in series. As shown in FIG. 3, the organic layer 5 is provided on the first electrodes 4. Since no pixel define layer 2 is provided between first electrodes 4, the organic layer 5 is formed in a plane-like structure, thus improving flatness and uniformity of the organic layer 5. Especially when the fill pattern 7 is formed between first electrodes 4, the first electrodes 4 achieve an effect of a planarization layer, which enables the organic layer 5 to be formed in a flatter planar structure, and further improves flatness and uniformity of the organic layer 5.

The second electrode 6 is formed on the organic layer 5. Preferably, the second electrode 6 covers the whole substrate 1, and accordingly, the second electrode 6 is also provided above the pixel define layer 2. Corresponding to the first electrodes 4 serving as anodes or cathodes, the second electrode 6 may accordingly serve as a cathode or an anode. If the second electrode 6 serves as a cathode, preferably, material of the second electrode 6 may include a metal or metal composition with low work function, for example, any one or combination of Al, Mg, Ca, Ba, Na, Li, K and Ag; if the second electrode 6 serves as an anode, preferably, material of the second electrode 6 may include a transparent or semi-transparent conductive material with high work function, for example, ITO, Ag, NiO, Al or grapheme. Since no pixel define layer 2 is provided between adjacent first electrodes 4, the organic layer 5 is formed in a plane-like structure, so that the second electrode 6 on the organic layer 5 is also formed in a plane-like structure, thus improving flatness and uniformity of the second electrode 6. Especially when the fill pattern 7 is formed between adjacent first electrodes 4, the first electrodes 4 achieve an effect of a planarization layer, which allows the organic layer 5 and second electrode 6 to be formed in flatter planar structures, further improves flatness and uniformity of the organic layer 5, and meanwhile possibility of electric leakage is reduced, so that stability and yield rate of the light-emitting device are improved.

The light-emitting device may be a bottom-emission type light-emitting device or a top-emission type light-emitting device.

The light-emitting device provided by the present embodiment may be an OLED.

In the present embodiment, if the light-emitting device is a bottom-emission type light-emitting device, the first electrodes 4 are formed by adopting a transparent material, and the second electrode 6 is formed by adopting a reflective material. The material of the first electrodes 4 may be a transparent or semi-transparent conductive material with high work function, such as ITO, Ag, NiO, Al or grapheme; the material of the second electrode 6 may be a metal or metal composition with low work function, for example, any one or combination of Al, Mg, Ca, Ba, Na, Li, K and Ag.

In the present embodiment, if the light-emitting device is a top-emission type light-emitting device, the first electrodes 4 are formed by adopting a reflective material, and the second electrode 6 is formed by adopting a transparent material. The material of the first electrodes 4 may be a metal or metal composition with low work function, for example, any one or combination of Al, Mg, Ca, Ba, Na, Li, K and Ag; the material of the second electrode 6 may be a transparent or semi-transparent conductive material with high work function, such as ITO, Ag, NiO, Al or grapheme.

Further, if the light-emitting device needs to realize color display, the light-emitting device may further comprise: color filter patterns (not shown). The color filter patterns may be formed above the second electrode 6 or below the first electrodes 4. If the light-emitting device is a top-emission type light-emitting device, the color filter patterns are formed above the second electrode 6; if the light-emitting device is a bottom-emission type light-emitting device, the color filter patterns are formed below the first electrodes 4. A portion of the organic layer right above each first electrode 4 corresponds to one color filter pattern. The portion of the organic layer right above each first electrode 4 and the corresponding color filter pattern form one sub-pixel (that is, the sub-pixel is defined by gap 8 or fill pattern 7), and a plurality of sub-pixels form one pixel. For example, when RGB display mode is adopted, three sub-pixels forming one pixel are a red sub-pixel, a green sub-pixel and a blue sub-pixel, respectively. Specifically, arrangement modes of sub-pixels may include: side by side arrangement mode, square arrangement mode and triangle arrangement mode. In the present embodiment, the sub-pixels are arranged in side by side mode. In actual application, the pixel unit 3 may be formed in other arrangement modes, which are not listed one by one herein.

Further, the light-emitting device may further comprises: an encapsulation layer (not shown), and the encapsulation layer may be provided above the second electrode 6 (if the light-emitting device comprises color filter patterns, the encapsulation layer is provided above the color filter patterns). The encapsulation layer can protect the light-emitting device, and specifically, can effectively prevent the light-emitting device from being destroyed by water and oxygen. In the present embodiment, the encapsulation layer may be formed above the second electrode 6 (or color filter patterns) by using an encapsulation method such as glass frit, dam and fill encapsulation, film encapsulation, metal encapsulation or laminator encapsulation.

In the light-emitting device provided by the present embodiment, the pixel define layer defines at least one pixel unit, each of which comprises multiple first electrodes and the organic layer is provided on the multiple first electrodes. As a result, the formed film of the organic layer on the multiple first electrodes has relatively good flatness and portions of the organic layer on different first electrodes have substantially the same thickness, thus flatness and uniformity of the formed film of the organic layer is improved and further display quality of the light-emitting device is improved.

Figure 7:
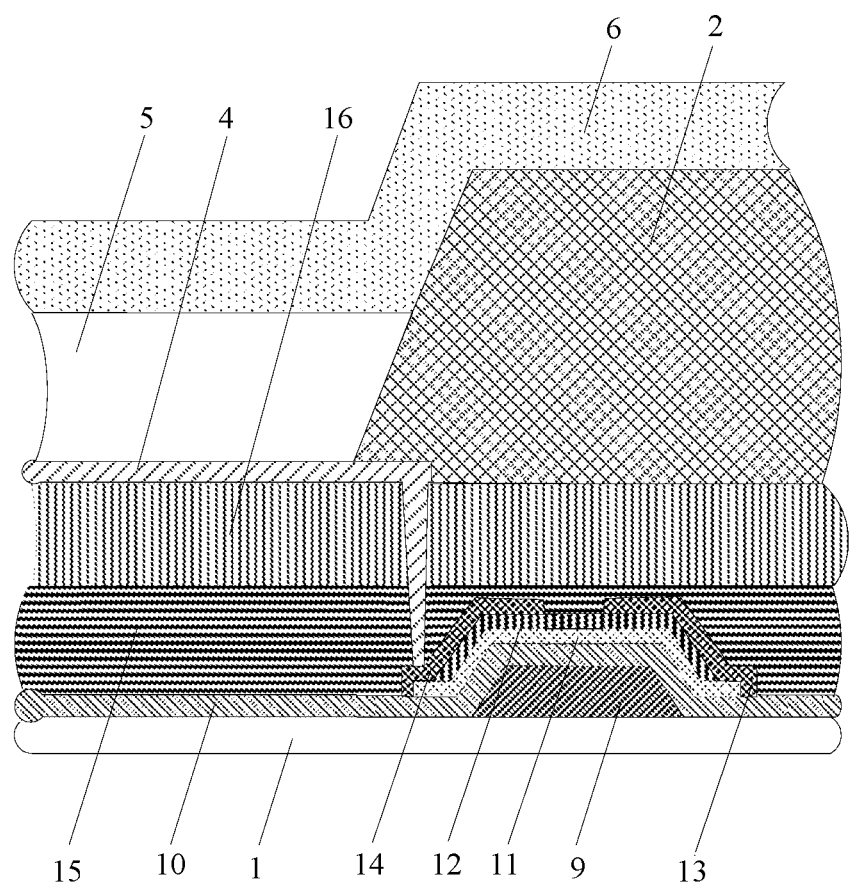
FIG. 7 is a schematic diagram of a structure of an array substrate provided by an embodiment of the present invention.

FIG. 7 is a schematic diagram of a structure of an array substrate provided by an embodiment of the present invention, and as shown in FIG. 7, the array substrate comprises: a light-emitting device which may include the light-emitting device provided by the above embodiment and is not repeated herein.

In the present embodiment, the light-emitting device may be a bottom-emission type light-emitting device or a top-emission type light-emitting device.

Further, the array substrate may further comprise a driving unit. In the present embodiment, the driving unit may comprise: thin film transistors (TFTs). As shown in FIG. 7, the TFT may comprise: a gate 9, an active layer 11, a etch stop layer (ESL) 12, a source 13 and a drain 14. Further, the array substrate may further comprise: a resin layer 16. Further, the array substrate may further comprise: a gate insulation layer 10 and a passivation layer 15. As shown in FIG. 7, specifically, the gate 9 is provided on the substrate 1, the gate insulation layer 10 is provided on the gate 9, the active layer 11 is provided on the gate insulation layer 10, the source 13 and drain 14 are provided on the active layer 11, and the passivation layer 15 is provided on the source 13 and drain 14. In the present embodiment, preferably, the TFT may have a thickness ranging from 1 μm to 100 mm. The resin layer 16 is provided on the passivation layer 15, and since the passivation layer 15 is generally thin, the resin layer 16 is set on the passivation layer 15 for the purpose of further improving planarization degree, so that the light-emitting device can be manufactured on a planarized surface. A via hole is provided in the passivation layer 15 and the resin layer 16, so that the first electrode 4 is connected to the drain 14 through the via hole. The light-emitting device is provided on the resin layer 16. Further, the array substrate may further comprise: gate lines and data lines (not shown), wherein the gate lines are electrically connected to the gates 9 and the data lines are electrically connected to the sources 13.

It should be noted that, FIG. 7 only illustrates a partial structure of the array substrate provided by the present embodiment, and specifically illustrates the structure of a part of the array substrate at the edge of the pixel unit 3 (i.e., a part of the array substrate adjacent to the pixel define layer). It can be understood that, in a sub-pixel structure in which no pixel define layer is included (i.e., a sub-pixel structure that is not at the edge of the pixel unit 3), TFT may be provided under the fill pattern 7.

In the technical solution of the array substrate provided by the present embodiment, the pixel define layer defines at least one pixel unit, each of which comprises multiple first electrodes and the organic layer is provided on the multiple first electrodes. As a result, the formed film of the organic layer on the multiple first electrodes has relatively good flatness and portions of the organic layer on different first electrodes have substantially the same thickness, thus flatness and uniformity of the formed film of the organic layer is improved and further display quality of the light-emitting device is improved.

An embodiment of the present invention provides a display device, which comprises: an array substrate. The array substrate may include the array substrate provided by the above embodiment, and is not elaborated herein.

In the display device provided by the present embodiment, the pixel define layer defines at least one pixel unit, each of which comprises multiple first electrodes and the organic layer is provided on the multiple first electrodes, so that the formed film of the organic layer on the multiple first electrodes has relatively good flatness and portions of the organic layer on different first electrodes have substantially the same thickness, thus flatness and uniformity of the formed film of the organic layer in the light-emitting device is improved and further display quality of the light-emitting device is improved.

Figure 8:
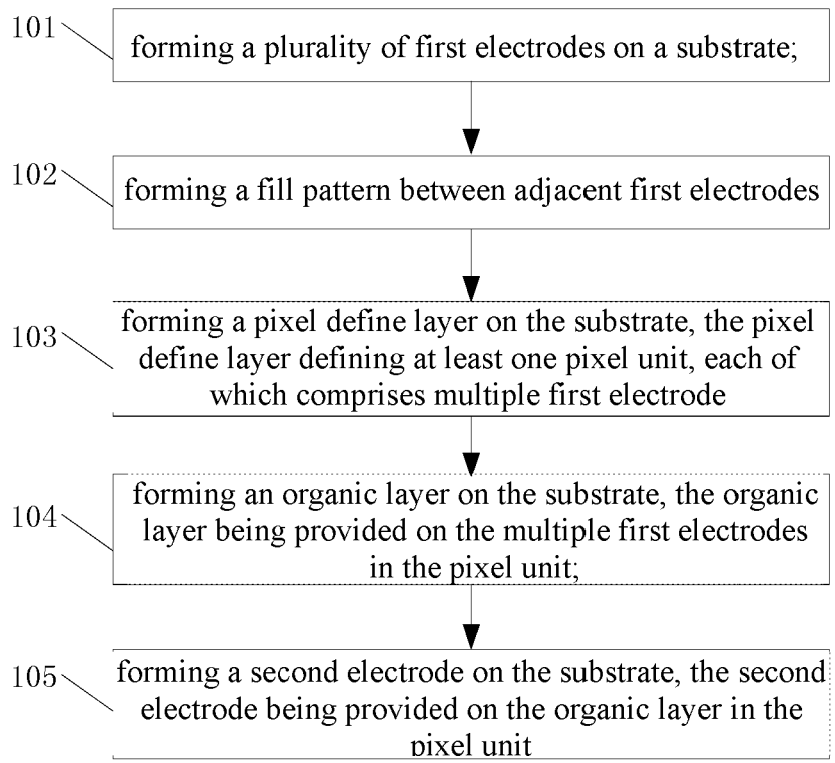
FIG. 8 is a flowchart of a manufacturing method of a light-emitting device provided by an embodiment of the present invention.

FIG. 8 is a flowchart of a manufacturing method of a light-emitting device provided by an embodiment of the present invention, and as shown in FIG. 8, the method comprises steps as follows.

At step 101, a plurality of first electrodes are formed on a substrate.

Figure 9A:
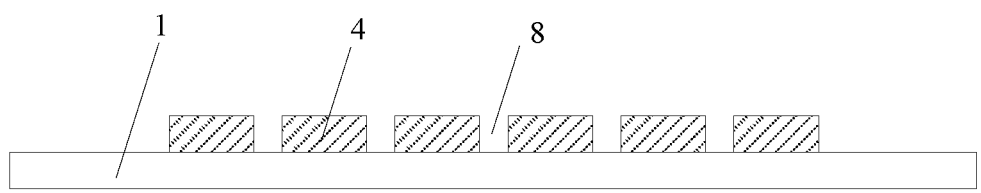
FIG. 9a is a schematic diagram of first electrodes formed according to the manufacturing method shown in FIG. 8.

FIG. 9a is a schematic diagram of forming the first electrodes in the present embodiment. As shown in FIG. 9a, first electrode material is deposited on the substrate 1, and the first electrodes 4 are formed by a patterning process.

Preferably, a gap 8 is formed between adjacent first electrodes 4, and therefore, the present embodiment may comprise step 102.

At step 102, a fill pattern is formed between adjacent first electrodes.

Figure 9B:
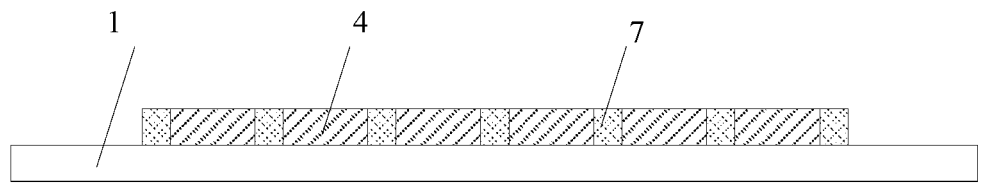
FIG. 9b is a schematic diagram of fill patterns formed according to the manufacturing method shown in FIG. 8.

FIG. 9b is a schematic diagram of forming the fill pattern in the present embodiment. As shown in FIG. 9b, fill material is formed on the substrate 1 by means of plasma enhanced chemical vapour deposition (PECVD), spin-coat, slit-coat or ink-jet printing, and then fill pattern 7 is formed between adjacent first electrodes 4 by a patterning process.

At step 103, a pixel define layer is formed on the substrate, and the pixel define layer defines at least one pixel unit, each of which comprises more than one of the first electrodes.

Preferably, there is a gap between the pixel define layer and the first electrodes, therefore, in step 102, the fill pattern is also formed between the pixel define layer and the first electrodes adjacent to the pixel define layer while forming the fill pattern between adjacent first electrodes, thus enlarging planarization region, and in this case, when the organic layer is formed subsequently, portions of the formed film on the first electrodes at the utmost edge and the first electrodes in the middle maintain uniform.

Figure 9C:
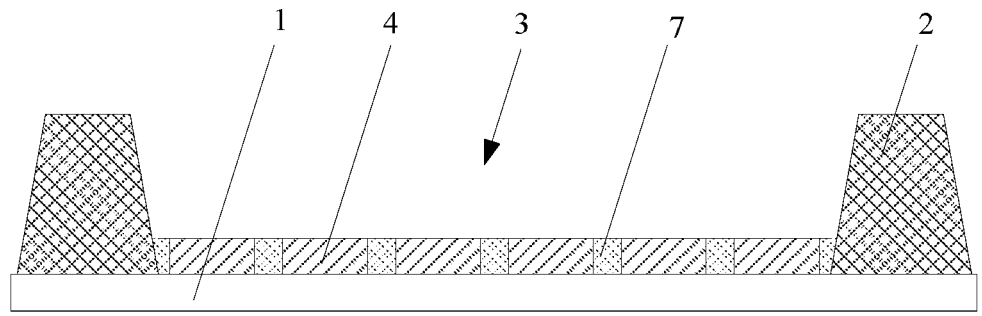
FIG. 9c is a schematic diagram of a pixel define layer formed according to the manufacturing method shown in FIG. 8.

FIG. 9c is a schematic diagram of forming the pixel define layer in the present embodiment, as shown in FIG. 9c, pixel define layer material is formed on the substrate 1 by means of plasma enhanced chemical vapour deposition (PECVD), spin-coat, slit-coat or ink-jet printing, and then the pixel define layer 2, which defines pixel unit(s) 3, is formed on the substrate 1 by a patterning process. In the present embodiment, if thicknesses of portions of the pixel define layer 2 are different, a half-tone mask or gray-tone mask needs to be used to expose the pixel define layer material during an exposure process in the patterning process, so as to form the pixel define layer 2 with different thicknesses at respective portions. Alternatively, repetitious filming process may be used to form the pixel define layer 2 with different thicknesses, and the repetitious filming process means that the pixel define layer 2 with different thicknesses at respective portions is formed by performing patterning process on the pixel define layer material several times after the pixel define layer material is formed on the substrate 1.

At step 104, an organic layer is formed on the substrate, and the organic layer is provided on the more than one of the first electrodes in each pixel unit.

Figure 9D:
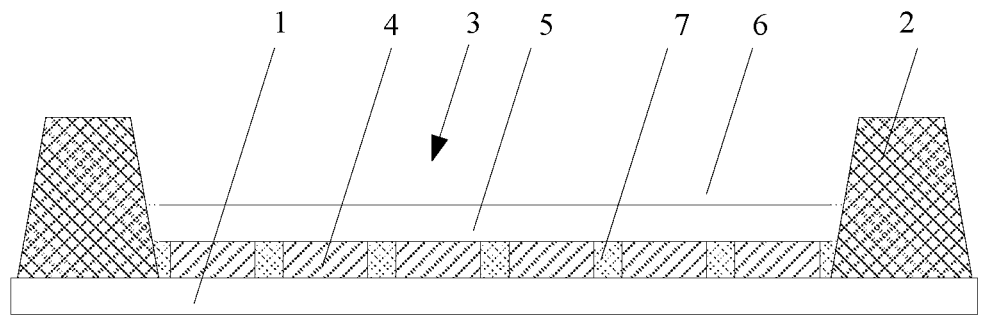
FIG. 9d is a schematic diagram of an organic layer formed according to the manufacturing method shown in FIG. 8.

FIG. 9d is a schematic diagram of forming the organic layer in the present embodiment. As shown in FIG. 9d, the organic layer 5 may be formed on the more than one of the first electrodes 1 in the pixel unit 3 through an evaporation process or a solution process. In the solution process, the organic layer 5 may be formed by way of ink-jet printing, nozzle coating or ink pouring. As long as the first electrodes 4 and the fill pattern 7 form a planar structure, ink droplets can spontaneously spread evenly over the planar structure when ink pouring method is used. Compared to the prior art, in the present embodiment, several film forming methods may be adopted in the solution process to form the organic layer 5, thus further broadening film forming methods of the solution process.

For the solution process, in the present embodiment, the number of the pixel define layer is relatively small, each pixel unit comprises multiple first electrodes, and therefore, coffee-ring phenomenon only occurs at portions of the organic layer adjacent to the pixel define layer, in the light-emitting device formed by using the present embodiment. Compared to the prior art in which coffee-ring phenomenon inevitably occurs at an edge portion of the organic layer 5 on each first electrode, the present embodiment greatly reduces occurrence of coffee-ring, and thus improve flatness and uniformity of the formed film.

At step 105, a second electrode is formed on the substrate, and the second electrode is provided on the organic layer in the pixel unit.

As shown in FIG. 3, the second electrode 6 is deposited on the substrate.

In the present embodiment, a patterning process may comprise processes such as photoresist coating, exposing, developing, etching, photoresist stripping, and the like.

The above sequence in which the steps are performed is a preferable solution, and may be adjusted according to production requirements in actual application. For example, step 103 may be performed before step 102 without impacting the effect achieved by the present invention.

The manufacturing method of a light-emitting device provided by the present embodiment may be used to manufacture the light-emitting device provided by the above embodiment, and specific descriptions of structures in the light-emitting device may refer to the above description of the embodiment, and are not repeated herein.

In the light-emitting device manufactured by using the manufacturing method of a light-emitting device provided by the present embodiment, the pixel define layer defines at least one pixel unit, each of which comprises multiple first electrodes and the organic layer is provided on the multiple first electrodes, so that the formed film of the organic layer on the multiple first electrodes has relatively good flatness and portions of the organic layer on different first electrodes have substantially the same thickness, thus flatness and uniformity of the formed film of the organic layer in the light-emitting device is improved and further display quality of the light-emitting device is improved. With the manufactured method provided by the present embodiment, the light-emitting device can be manufactured relying on an existing process and devices, the manufacturing process is simple and easy to implement.

It can be understood that, the above implementations are merely exemplary implementations for explaining the principle of the present invention, but the present invention is not limited thereto. For those skilled in the art, various variations and improvements may be made without departing from the spirit and essence of the present invention, and these variations and improvements are also deemed as the protection scope of the present invention.

The invention claimed is:

1. A light-emitting device, comprising: a substrate and a pixel define layer provided on the substrate, the pixel define layer defining at least one pixel unit, each of which comprises a plurality of first electrodes, an organic layer provided on the plurality of first electrodes, and a second electrode provided on the organic layer, wherein the organic layer is an integral layer having a planar structure and covers the plurality of first electrodes, a fill pattern is formed between adjacent first electrodes, a thickness of the fill pattern is smaller than that of the pixel define layer, is substantially the same as that of the first electrode wherein the upper surface of the fill pattern and the upper surface of the first electrodes are coplanar.

2. The light-emitting device according to claim 1, wherein, the fill pattern is also formed between the pixel define layer and the first electrodes adjacent to the pixel define layer.

3. The light-emitting device according to claim 1, wherein, a difference between the thickness of the fill pattern and the thickness of the first electrode ranges from −10 nm to 50 nm.

4. The light-emitting device according to claim 3, wherein, the difference between the thickness of the fill pattern and the thickness of the first electrode is larger than 0 nm and smaller than or equal to 50 nm.

5. The light-emitting device according to claim 1, wherein, the entire fill pattern has the same thickness.

6. The light-emitting device according to claim 1, wherein, the pixel define layer has a ring-like structure.

7. The light-emitting device according to claim 6, wherein, a longitudinal section of the pixel define layer is trapezoid-shaped or square-shaped.

8. The light-emitting device according to claim 1, wherein, the pixel define layer defines one pixel unit, and is provided in a non-light emitting region on the periphery of the light-emitting device.

9. The light-emitting device according to claim 2, wherein, the pixel define layer defines one pixel unit, and is provided in a non-light emitting region on the periphery of the light-emitting device.

10. The light-emitting device according to claim 5, wherein, the pixel define layer defines one pixel unit, and is provided in a non-light emitting region on the periphery of the light-emitting device.

11. The light-emitting device according to claim 6, wherein, the pixel define layer defines one pixel unit, and is provided in a non-light emitting region on the periphery of the light-emitting device.

12. An array substrate, comprising the light-emitting device according to claim 1.

13. A manufacturing method of a light-emitting device, comprising steps of:

forming a plurality of first electrodes on a substrate;

forming a pixel define layer on the substrate, the pixel define layer defining at least one pixel unit, each of which comprises more than one of the first electrodes;

forming a fill pattern between adjacent first electrodes, wherein a thickness of the fill pattern is smaller than that of the pixel define layer, is substantially the same as that of the first electrode wherein the upper surface of the fill pattern and the upper surface of the first electrodes are coplanar;

forming, as a whole, an organic layer having a planar structure on the substrate, the organic layer being provided on and covering the more than one of the first electrodes in the pixel unit; and forming a second electrode on the substrate, the second electrode being provided on the organic layer in the pixel unit.

14. The manufacturing method of a light-emitting device according to claim 13, wherein, the fill pattern is formed between the pixel define layer and the first electrodes adjacent to the pixel define layer while forming the fill pattern between adjacent first electrodes.

15. The manufacturing method of a light-emitting device according to claim 13, wherein, the step of forming an organic layer on the substrate comprises:

forming the organic layer on the more than one of the first electrodes in the pixel unit through an evaporation process or a solution process.

16. The manufacturing method of a light-emitting device according to claim 14, wherein, the step of forming an organic layer on the substrate comprises:

forming the organic layer on the more than one of the first electrodes in the pixel unit through an evaporation process or a solution process.

* * * * *